United States Patent [19]

Hagiwara

[11] Patent Number: 5,247,936

[45] Date of Patent: * Sep. 28, 1993

[54] MAGNETIC RESONANCE IMAGING METHOD AND APPARATUS REVERSING WHITE AND BLACK

[75] Inventor: Masayuki Hagiwara, Tokyo, Japan

[73] Assignee: Kabushiki Kaisha Toshiba, Kanagawa, Japan

[*] Notice: The portion of the term of this patent subsequent to Jan. 7, 2009 has been disclaimed.

[21] Appl. No.: 931,449

[22] Filed: Aug. 20, 1992

Related U.S. Application Data

[63] Continuation of Ser. No. 379,121, Jul. 13, 1989, abandoned.

[30] Foreign Application Priority Data

Jul. 27, 1988 [JP] Japan ................................. 63-185516

[51] Int. Cl.$^5$ ............................................... A61B 5/55
[52] U.S. Cl. ................................. 128/653.2; 324/309; 128/653.3
[58] Field of Search .......................... 128/653.2, 653.3; 358/111; 324/309

[56] References Cited

U.S. PATENT DOCUMENTS

| | | | |
|---|---|---|---|
| 4,710,876 | 12/1987 | Cline et al. | 128/653 X |
| 4,770,182 | 9/1988 | Damadian et al. | 128/653 |
| 4,784,146 | 11/1988 | Mancuso et al. | 128/653 |
| 4,862,086 | 8/1989 | Maeda | 324/318 |
| 5,078,141 | 1/1992 | Suzuki et al. | 128/653.2 |

Primary Examiner—Lee S. Cohen
Assistant Examiner—Kevin Pontius
Attorney, Agent, or Firm—Finnegan, Henderson, Farabow, Garrett & Dunner

[57] ABSTRACT

A method and apparatus for acquiring a magnetic resonance image representing a surface anatomy of an object, the method comprising the steps of setting a surface coil near the head of a subject, executing a predetermined pulse sequence for selecting magnetic resonance signals from protons inside the head, thereby applying a static magnetic field, gradient magnetic field, and a radio frequency pulse, detecting the magnetic resonance signals from protons by using the surface coil in accordance with the predetermined pulse sequence, reconstructing an image representing the brain surface anatomy of the subject utilizing the detected magnetic resonance signals, and displaying the image in gray scale so that the distribution of the protons is displayed in black level in proportion to the density thereof.

9 Claims, 3 Drawing Sheets

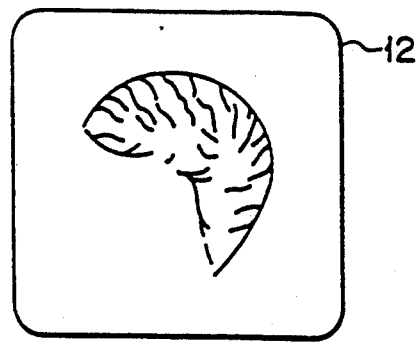
F I G. 4

MAGNETIC RESONANCE IMAGING METHOD AND APPARATUS REVERSING WHITE AND BLACK

This application is a continuation of application Ser. No. 07/379,121, filed Jul. 13, 1989, now abandoned.

BACKGROUND OF THE INVENTION

1. Field of the Invention

The present invention relates to a magnetic resonance imaging method and system for imaging an object based upon a function of the spin density distribution of the specific nucleus, especially for performing surface-anatomic scanning (SAS) of the brain.

Further, the present invention relates to U.S. application Ser. No. 07/343,635 filed on Apr. 27, 1989 by the same assignee of the present invention.

2. Description of the Related Art

In a magnetic resonance (MR) phenomenon, an atomic nucleus having a magnetic moment and placed in a static field absorbs or emits an electromagnetic wave having a specific frequency by resonance. A resonance frequency (Lamor frequency) $\nu 0$ of the atomic nucleus is represented by the following equation:

$$\nu 0 = \gamma H_O / 2 \qquad (1)$$

Where $\gamma$ is the magnetogyric ratio unique to the type of atomic nucleus, and $H_O$ is the strength of a static field.

An apparatus for diagnosing the inside of a subject by utilizing the MR phenomenon detects an electromagnetic wave generated inside the subject and processes the electromagnetic wave as an MR signal. A slice image of the subject which includes an atomic nucleus density, a longitudinal relaxation time T1, a lateral relaxation time T2, a flow, and a chemical shift can be noninvasively obtained. The MR signal can be obtained by exciting the entire subject placed in the static field. However, in practice, only a predetermined portion of the subject is excited to obtain the MR signal due to structural limitations of the apparatus and clinical requirements.

In surgical treatment for disease within the cranium of the subject, it is very important to, acquire an image representing an anatomy of a brain surface such as brain grooves or the like in order to find the position of a local cortical or subcortical diseased portion. For this reason, images are acquired by MRI. For example, when a head coil having a shape for surrounding a head of a subject is used, images including subcortical information are obtained since an MR signal for the entire head is acquired. When a surface coil is used in a prior pulse sequence (short SE), many MR signals from the subcutaneous fat and the like of the surface layer are obtained by sensibility characteristics (highly sensible to signals from a portion near the coil) of the coil. Therefore, it is difficult to accurately grasp the position of a local cortical or subcortical diseased portion in the head.

Strong demand therefore has arisen for an apparatus capable of acquiring and displaying a brain surface real anatomy to accurately find the positions of diseased portions located on the brain surface of the head of the subject.

SUMMARY OF THE INVENTION

It is an object of the present invention to provide a method of acquiring an image representing a brain surface anatomy and a system for practicing the method.

The present invention provides for the suppressing a signal from the surface fat of a brain and below the brain surface. With the present invention it is possible to advantageously display the cerebro spinal fluid (CSF) by a long TE pulse sequence. With this technique the brain and CSF may be displayed in good contrast.

In a conventional imaging method, it is inconvenient to show the brain surface with a white display because it is different from a real brain surface structure seen by the operator. Therefore, the manipulation of reversing the white and black scale makes it possible to get a better image of a real brain surface structure.

This technology is very important to the operator.

According to one aspect of the present invention, there is provided a method for acquiring an image representing a brain surface anatomy of a subject in a magnetic resonance imager. The method comprises the steps of: setting a surface coil near the head of the subject; a predetermined pulse sequence for selecting magnetic resonance signals from protons inside the head in a static magnetic field, thereby applying gradient magnetic fields and a radio frequency pulse; detecting the magnetic resonance signals from protons by using the surface coil in accordance with the predetermined pulse sequence; and acquiring the image representing the brain surface anatomy of the subject by inverting the contrast of the image.

According to another aspect of the present invention, there is provided a system for acquiring an image representing a brain surface anatomy inside the head of a subject in a magnetic resonance imager the system comprises: static magnetic field applying means for applying a static magnetic field to the head of the subject; gradient magnetic field applying means for applying gradient magnetic fields to the head of the subject; surface coil means for transmitting a radio frequency pulse to the head of the subject and for detecting magnetic resonance signals from the subject, the surface coil means located near the head of the subject; pulse sequence control means for controlling the gradient magnetic field generating means and the surface coil means in accordance with a predetermined pulse sequence, the predetermined pulse sequence being executed for selecting the magnetic resonance signals from protons inside the head; processing means for processing the magnetic resonance signals detected by the surface coil means in accordance with the pulse sequence control means; and a sign reversion means, thereby acquiring the image representing the brain surface anatomy.

BRIEF DESCRIPTION OF THE DRAWINGS

FIG. 4 is a diagram explaining a display example of an MR image according to the present invention;

DETAILED DESCRIPTION OF THE PREFERRED EMBODIMENT

A preferred embodiment of the present invention will be described in detail with reference to the accompanying drawings.

Figure 1:
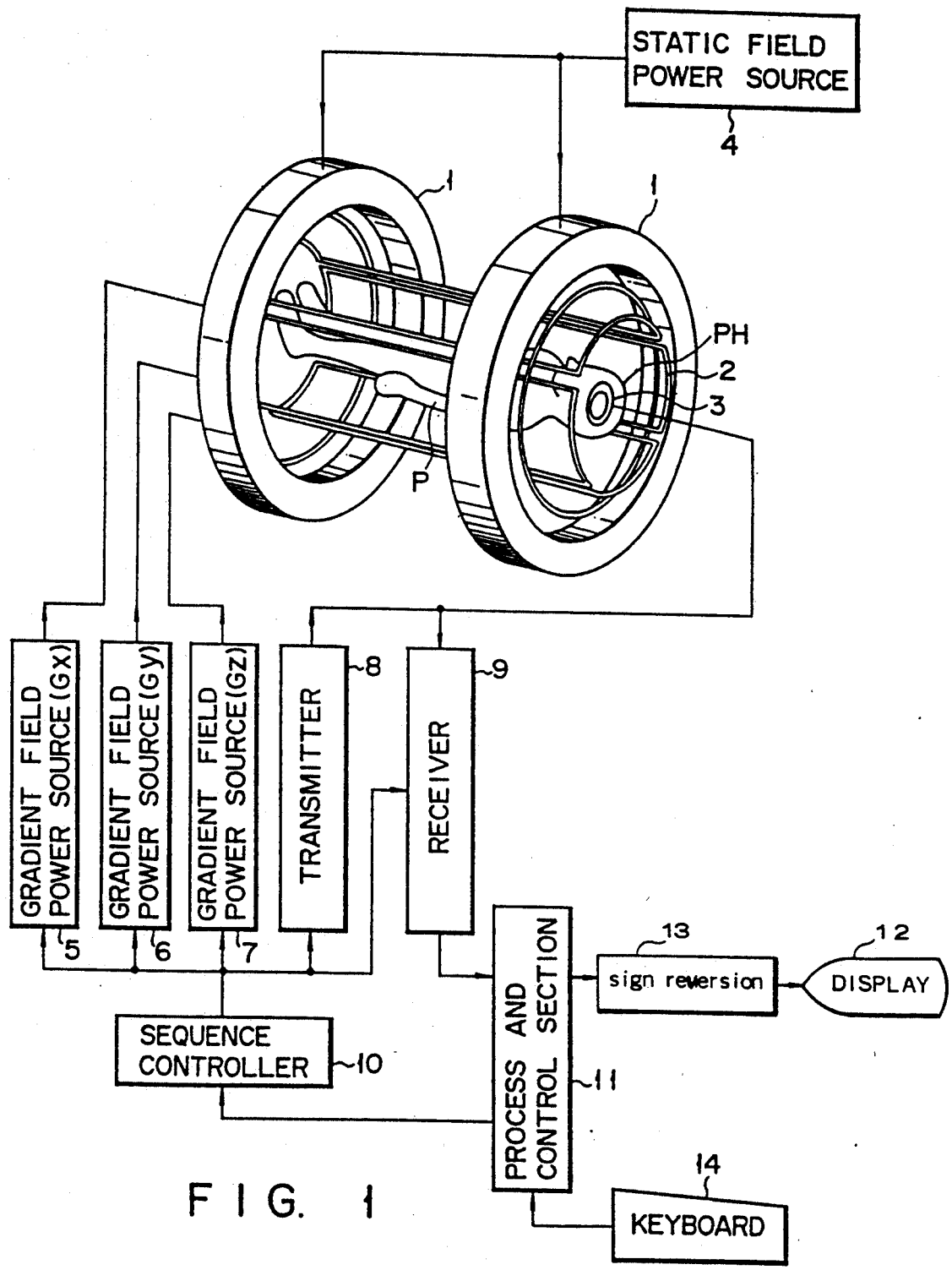
FIG. 1 is a schematic view and block diagram showing an arrangement of an MRI system according to the present invention.

In an MRI system shown in FIG. 1, a magnet assembly capable of holding a subject P therein comprises normal conductive or superconductive coils (correction shim coils may also be used hereto) 1 for generating a static magnetic field, coils 2 for generating X-, Y-, and Z-axis gradient magnetic fields in a predetermined portion of the subject P, and a surface coil 3 for transmitting RF pulses and for detecting an MR signal. The surface coil 3 is located near the head PH of the subject P. The surface coil 3 may be used to detect only the MR signal. The transmission of RF pulses may be performed by another coil. Permanent magnets may be used in place of the coils 1 to generate a static field.

If the MRI system includes the superconductive coils 1, the system also includes a static field power source 4 with a cooling unit. The system shown in FIG. 1 includes a transmitter 8 for controlling transmission of RF pulses, a receiver 9 for controlling reception of a MR signal, gradient field power sources 5, 6, and 7 for supplying currents to the coils 2, a sequence controller 10 for executing a pulse sequence (to be described later), a process and control section 11 for controlling the controller 10 and processing the received MR signal, a display 12, and a keyboard 14.

In the above system, RF pulses are applied from the transmitter 8 to the coil 3 Gradient fields $G_X$, $G_Y$, and $G_Z$ are generated by the gradient field power sources 5, 6, and 7 and applied from the coils 2 to the subject P. The gradient field $G_X$, $G_Y$, and $G_Z$ provide, for example, slicing, phase encoding, and reading gradient fields, respectively. The MR signal from the predetermined portion of the head PH of the subject P is detected by the surface coil 3. The above sequence is repeated a plurality of times to obtain MR data, and an MR image is reconstructed on the basis of the MR data.

The general pulse sequence of MRI will be described below.

Figure 2:
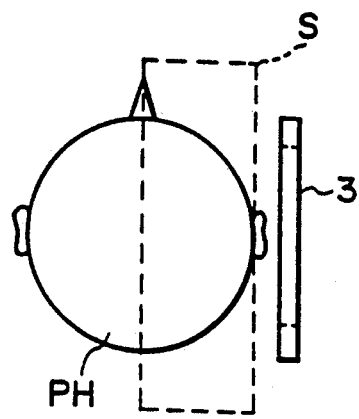
FIG. 2 is a schematic view showing a surface coil layout.

As shown in FIG. 2, the surface coil 3 is located near the head PH of the subject P. The pulse sequence is executed by a spin echo (SE) method shown in FIG. 3. A 90° pulse and a slicing gradient field ($G_Z$) (not shown) are applied to the subject P. Gradient field conditions, i.e., a ratio of the gradient fields $G_X$, $G_Y$, and $G_Z$, (the factor of slice width are set such that almost half of the head serves as a slice portion. A 180° pulse, a phase encoding gradient field that a line scan, and a reading gradient field are applied to the head PH of the subject P. Shown in FIG. 3, an echo time $T_E$ is set to be about 200 msec (i.e. 250 msec) to obtain MR signals. A repetition time $T_R$ is set to be about 2,000 msec or more for repeating the pulse sequence.

As magnetization the proton may be almost sufficiently recovered during the above pulse repetition time $T_R$, the intensity of the MR signal from protons of CSF of the brain grooves is increased. The MR signal from the fat protons on the surface layer of the head PH can be suppressed by using an echo time $T_E$ of 250 msec, because the $T_2$ relaxation time of fat is very much shorter than that of water.

Brain grooves are displayed on the display 12 without any overlapping by the other portions by the above-mentioned methods which are called SAS (Surface Anatomy Scan method), as shown in FIG. 4. Therefore, a medical image clearly representing a positional relationship and a distance between the brain surface and disease portions can be obtained.

As shown in FIG. 1, the sign reversion means 13 is added as a new unit to the prior art. The sign reversion means 13 connects to the process and control section 11, and is connected to the display 12. The keyboard 14 connects to the process and control section 11.

Figure 3:
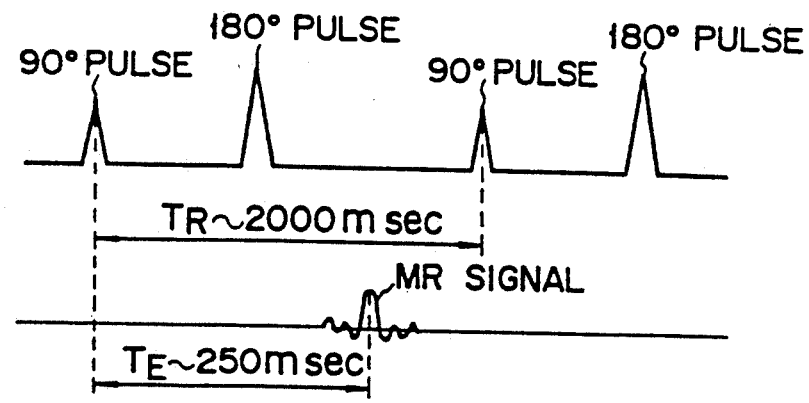
FIG. 3 is a timing chart showing a pulse sequence for executing SAS technique.

According to this embodiment, the process and control section 11 works as a controller of all parts, and works as a controller which detect magnetic resonance signals. When the pulse sequence shown in FIG. 3 is executed, MR signals from fat protons are suppressed, and MR signals from water protons mainly are detected. The process and control section 11 also works as a means of reconstructing detected signals. The sign reversion means 13 can reverse the sign of the pixel, and can show a picture in a reverse fashion white and black on the connected display 12.

An operator can operate the pos/neg reversing switch on the keyboard 14. When he selects the switch positive or negative, he can show the different colored images on the display 12.

Therefore the reconstructed image of the CSF color appears white.

In the other case when he selects negative, the sign of the pixels is reversed by the sign reversion means 13 connected to the process and control section 11.

As the result of selecting negative, the reconstructed image of the CSF appears black.

Accordingly, it is possible to perform accurate operation by displaying the reversed images, without wasting much time.

By this method the brain surface could be locally displayed as an anatomy scan on the display 12. The relationship between brain surface and disease portion is very clearly illustrated, and it is possible to supply a very profitable anatory information from a view of clinical pathology.

By the way the a method of displaying a brain surface is not limited to the spin echo sequence technique. For example, field echo, Inversion recovery sequence techniques, etc. may be used.

What is claimed is:

1. A method for acquiring an MR image representing a surface anatomy of a brain disposed within the head of a subject, the method comprising the steps of:

placing a surface coil proximate to the head of the subject;

executing a predetermined pulse sequence so that magnetic resonance signals from protons of water are enhanced and magnetic resonance signals from protons of fat tissue are suppressed;

detecting the magnetic resonance signals from protons by using the surface coil in accordance with the predetermined pulse sequence;

reconstructing an image representing the surface anatomy of the brain of the subject utilizing said detected magnetic resonance signals; and displaying the image in gray scale so that the distribution of the protons from water is displayed with black pixels in proportion to the density of the protons from water.

2. The method according to claim 1, further comprising the steps of:

setting a region of interest on the acquired image;

obtaining MR signal data by executing the predetermined pulse sequence for the region of interest; and displaying the acquired image, or the obtained MR signal data.

3. The method according to claim 1, wherein said executing step includes the substep of providing an echo time $T_E$ of about 200 msec.

4. The method according to claim 1, wherein said executing step includes the substep of providing an echo time $T_E$ of 250 msec.

5. The method according to claim 1, wherein said executing step includes the substep of providing a repetition time $T_R$ of at least about 2000 msec.

6. A system for acquiring an MR image surface anatomy of a brain disposed within the head of a subject in a magnetic resonance image, the system comprising:

static magnetic field generating means for applying a static magnetic field to the subject;

gradient magnetic field generating means for applying gradient magnetic fields to the subject;

surface coil means for transmitting radio frequency pulses to the subject and detecting magnetic resonance signals from the subject, the surface coil means located proximate to the head of the subject;

pulse sequence control means for controlling the static magnetic field generating means, the gradient magnetic field generating means, and the surface coil means in accordance with a predetermined pulse sequence, the predetermined pulse sequence being executed so that magnetic resonance signals from protons of water are enhanced and magnetic resonance signals from protons of fat tissue are suppressed;

processing means for processing the magnetic resonance signals detected by the surface coil means in accordance with the pulse sequence control means, thereby producing an image representing the surface anatomy of the brain of the subject; and display means for displaying the image in gray scale so that the distribution of the protons from water is displayed with black pixels in proportion to the density of the protons from water.

7. The system according to claim 6, wherein the predetermined pulse sequence includes an echo time $T_E$ of about 200 msec.

8. The system according to claim 6, wherein the predetermined pulse sequence includes an echo time $T_E$ of 250 msec.

9. The system according to claim 6, wherein the predetermined pulse sequence includes a repetition time $T_R$ of at least about 2000 msec.

* * * * *